United States Patent
Strachan et al.

(10) Patent No.: US 11,294,763 B2
(45) Date of Patent: Apr. 5, 2022

(54) DETERMINING SIGNIFICANCE LEVELS OF ERROR VALUES IN PROCESSES THAT INCLUDE MULTIPLE LAYERS

(71) Applicant: HEWLETT PACKARD ENTERPRISE DEVELOPMENT LP, Houston, TX (US)

(72) Inventors: John Paul Strachan, Palo Alto, CA (US); Catherine Graves, Palo Alto, CA (US); Dejan S. Milojicic, Palo Alto, CA (US); Paolo Faraboschi, Palo Alto, CA (US); Martin Foltin, Fort Collins, CO (US); Sergey Serebryakov, Palo Alto, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 531 days.

(21) Appl. No.: 16/115,100

(22) Filed: Aug. 28, 2018

(65) Prior Publication Data
US 2020/0073755 A1    Mar. 5, 2020

(51) Int. Cl.
G06F 11/00    (2006.01)
G06F 11/10    (2006.01)
G11C 29/52    (2006.01)

(52) U.S. Cl.
CPC ........ G06F 11/1072 (2013.01); G06F 11/106 (2013.01); G11C 29/52 (2013.01)

(58) Field of Classification Search
CPC ............... G06F 11/0727; G06F 11/073; G06F 11/1008; G06F 11/2053; G06F 11/1072; G06F 11/106; G06F 11/1048
USPC ....................................................... 714/1–57
See application file for complete search history.

(56) References Cited

U.S. PATENT DOCUMENTS

| 5,828,812 | A  |    | 10/1998 | Khan et al. |
| 7,406,652 | B2 | *  | 7/2008  | Tseng ............ H04L 25/49 714/56 |
| 8,745,279 | B2 |    | 6/2014  | Kreissig et al. |
| 8,924,786 | B2 | *  | 12/2014 | Menon ............ G11C 29/022 714/25 |
| 9,847,974 | B2 |    | 12/2017 | Kompalli |

(Continued)

FOREIGN PATENT DOCUMENTS

| CN | 106463171 | 2/2017 |
| CN | 107636640 | 1/2018 |

(Continued)

OTHER PUBLICATIONS

Ben Feinberg et al., "Making Memristive Neural Network Accelerators Reliable," Feb. 2018, pp. 1-14, University of Rochester, Rochester, NY, USA.

(Continued)

*Primary Examiner* — Sarai E Butler
(74) *Attorney, Agent, or Firm* — Mahamedi Paradice LLP

(57) ABSTRACT

A computer system includes multiple memory array components that include respective analog memory arrays which are sequenced to implement a multi-layer process. An error array data structure is obtained for at least a first memory array component, and from which a determination is made as to whether individual nodes (or cells) of the error array data structure are significant. A determination can be made as to any remedial operations that can be performed to mitigate errors of significance.

25 Claims, 3 Drawing Sheets

(56) References Cited

U.S. PATENT DOCUMENTS

| | | | |
|---|---|---|---|
| 2003/0023893 A1* | 1/2003 | Lee | H04L 45/24 714/4.5 |
| 2004/0019835 A1* | 1/2004 | Marisetty | G06F 11/0793 714/48 |
| 2005/0041472 A1* | 2/2005 | Matsuoka | H01L 29/7923 365/185.16 |
| 2006/0039196 A1* | 2/2006 | Gorobets | G11C 29/76 365/185.01 |
| 2008/0098280 A1* | 4/2008 | Andersen | G11B 20/1879 714/766 |
| 2010/0100764 A1* | 4/2010 | Kalos | G06F 11/2028 714/6.12 |
| 2014/0172937 A1 | 6/2014 | Linderman et al. | |
| 2015/0248332 A1* | 9/2015 | Ordentlich | G11C 17/165 714/6.24 |
| 2016/0085653 A1* | 3/2016 | Li | G06F 11/2094 714/6.3 |
| 2016/0379092 A1 | 12/2016 | Kutliroff | |
| 2016/0379115 A1 | 12/2016 | Burger et al. | |
| 2017/0102997 A1* | 4/2017 | Purushothaman | G06F 11/0784 |
| 2017/0134038 A1 | 5/2017 | Buchanan | |
| 2017/0148513 A1 | 5/2017 | Buchanan | |
| 2017/0185543 A1 | 6/2017 | Nieuwejaar | |
| 2017/0206962 A1 | 7/2017 | Buchanan | |
| 2017/0221579 A1* | 8/2017 | Buchanan | G06F 7/5443 |
| 2017/0249989 A1 | 8/2017 | Strachan et al. | |
| 2017/0345497 A1 | 11/2017 | Kvatinsky et al. | |
| 2018/0012411 A1 | 1/2018 | Richey et al. | |
| 2018/0075337 A1 | 3/2018 | Buchanan et al. | |
| 2018/0095930 A1 | 4/2018 | Lu | |
| 2018/0309451 A1 | 10/2018 | Lu et al. | |
| 2019/0189174 A1 | 6/2019 | Hu et al. | |
| 2020/0053121 A1* | 2/2020 | Wilcox | G06F 40/30 |
| 2020/0073755 A1 | 3/2020 | Strachan et al. | |
| 2020/0312406 A1 | 10/2020 | Sharma et al. | |

FOREIGN PATENT DOCUMENTS

| | | |
|---|---|---|
| CN | 108205705 | 6/2018 |
| CN | 108431895 | 8/2018 |
| CN | 109063833 | 12/2018 |

OTHER PUBLICATIONS

Brandon Reagen et al., "Minerva: Enabling Low-power, Highly-accurate Deep Neural Network Accelerators," Jun. 2016, pp. 1-12, Harvard University.

Gupta, D. S., "Transfer Learning and the Art of Using Pre-Trained Models in Deep Learning," June 1, 2017, https://www.analyticsvidhya.com/blog/2017/06/transfer-learning-the-art-of-fine-tuning-a-pre-trained-model/.

Jiang, H. et al. "Pulse-Width Modulation based Dot-Product Engine for Neuromorphic Computing System using Memristor Crossbar Array," May 27-30, 2018, IEEE, pp. 1-4.

Lerong Chen et al., "Accelerator-friendly Neural-network Training: Learning Variations and Defects in RRAM Crossbar," Mar. 2017, pp. 19-24, EDAA.

Mathew, J. et al., "Fault Detection and Repair of DSC Arrays through Memristor Sensing," Oct. 12-14, 2015, IEEE, pp. 7-12.

Thibaut Marty et al., "Algorithm Level Timing Speculation for Convolutional Neural Network Accelerators," Jun. 8, 2018, pp. 1-21, HAL.

Gupta, D.; "Transfer Learning & the Art of using Pre-trained Models in Deep Learning"; Jun. 1, 2017; 27 pages.

Duan, S. et al., "The Design of a Graphical User Interface for a Memristor and its Application in Memory of Memristive Crossbar Array," Journal of Southwest University (Natural Sciences Edition), Sep. 2014.

* cited by examiner

DETERMINING SIGNIFICANCE LEVELS OF ERROR VALUES IN PROCESSES THAT INCLUDE MULTIPLE LAYERS

BACKGROUND

Various types of computing applications utilize vector and matrix operations to implement data flow processes. For example, neural network computations are typically matrix operations, and applications of neural networks can encompass computational activities that include image recognition and classification.

DETAILED DESCRIPTION

Figure 1:
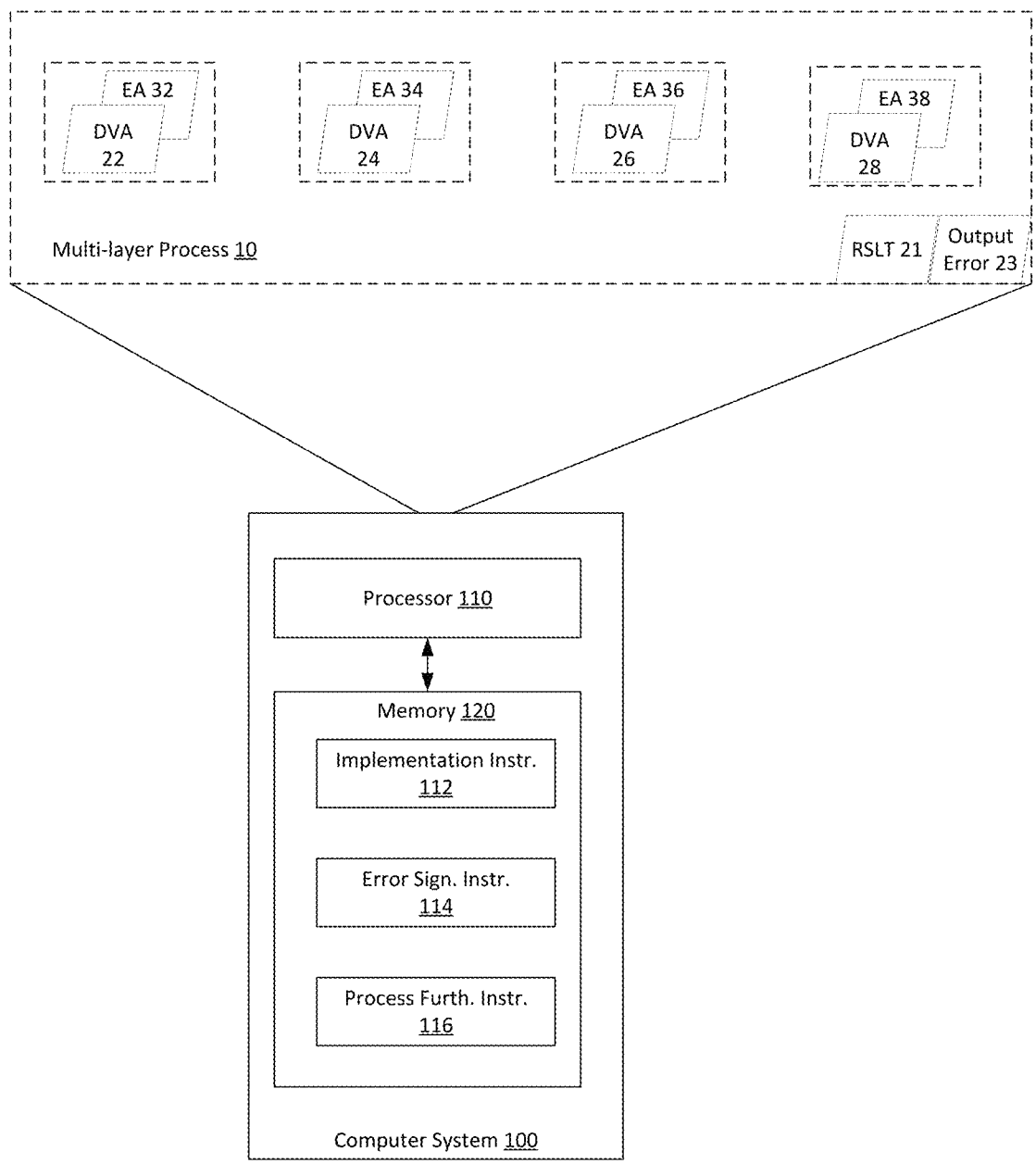
FIG. 1 illustrates an example computer system to determine significance of error values in multi-layered computational processes.

A computer system includes multiple memory array components that include respective analog memory arrays which are sequenced to implement a multi-layer process. An error array data structure is obtained for at least a first memory array component, and from which a determination is made as to whether individual nodes (or cells) of the error array data structure are significant. A determination can be made as to any remedial operations that can be performed to mitigate errors of significance.

One or more examples described provide that methods, techniques, and actions performed by a computing device are performed programmatically, or as a computer-implemented method. Programmatically, as used, means through the use of code or computer-executable instructions. These instructions can be stored in one or more memory resources of the computing device. A programmatically performed step may or may not be automatic.

One or more examples described can be implemented using programmatic modules, engines, or components. A programmatic module, engine, or component can include a program, a sub-routine, a portion of a program, or a software component or a hardware component capable of performing one or more stated tasks or functions. As used herein, a module or component can exist on a hardware component independently of other modules or components. Alternatively, a module or component can be a shared element or process of other modules, programs, or machines.

Some examples described can generally require the use of computing devices, including processing and memory resources. For example, one or more examples described may be implemented, in whole or in part, on computing devices such as servers, desktop computers, cellular or smartphones, and tablet devices. Memory, processing, and network resources may all be used in connection with the establishment, use, or performance of any example described herein (including with the performance of any method or with the implementation of any system).

Furthermore, one or more examples described may be implemented through the use of instructions that are executable by one or more processors. These instructions may be carried on a computer-readable medium. Machines shown or described with figures below provide examples of processing resources and computer-readable mediums on which instructions for implementing examples described can be carried and/or executed. In particular, the numerous machines shown with examples described include processor(s) and various forms of memory for holding data and instructions. Examples of computer-readable mediums include permanent memory storage devices, such as hard drives on personal computers or servers. Other examples of computer storage mediums include portable storage units, such as CD or DVD units, flash memory (such as carried on smartphones, multifunctional devices or tablets), and magnetic memory. Computers, terminals, network enabled devices (e.g., mobile devices, such as cell phones) are all examples of machines and devices that utilize processors, memory, and instructions stored on computer-readable mediums. Additionally, examples may be implemented in the form of computer-programs, or a computer usable carrier medium capable of carrying such a program.

FIG. 1 illustrates an example computer system to determine significance of error values in multi-layered computational processes. In an example of FIG. 1, a computer system 100 includes a processor 110 and a memory 120 that stores an instruction set. As described with examples, the processor executes the instruction set to monitor a multi-layered computational process 10, to determine a significance of error values determined at individual layers of the process 10. By way of example, the multilayered computational process 10 can correspond to a neural network implementation of a computer model. In such examples, each layer of the computation process can be represented by an array (or matrix), with each neuron of the network corresponding to a column of the array. As described in greater detail, the arrays can implement a data flow where the output of individual arrays is used as the input for another array of the data flow, until a final data result set is achieved.

In examples, the computer system 100 can be implemented on a server, workstation, mainframe, or user terminal (e.g., workstation). Accordingly, the processor 110 can represent multiple processors and/or processing resources, such as a bank of processors. In variations, the memory 120 can correspond to application memory, such as Random Access Memory (RAM) or Dynamic Random Access Memory (DRAM).

Depending on implementation, the process 10 can be implemented using a dedicated set of hardware resources. For example, the process 10 can be implemented on a set of memory resources that utilize analog values to reflect the respective data structure 22, 24, 26 and 28. Still further, in other variations, the process 10 can be implemented using logic and other software resources of the computer system 100. By way of example, the process 10 can be implemented as a separate computing environment. In other variations, the process 10 can be implemented within a same computing environment as processor 110 and memory 120.

According to examples, the process 10 includes stages or layers (shown in FIG. 1 as layers 12, 14, 16 and 18), with each layer representing a respective multi-dimensional data structure (or data value array ("DVA")) 22, 24, 26, and 28 that is subject to a set of operations. While an example of FIG. 1 illustrates use of four layers, in variations, more or fewer layers can be used. The process 10 can sequence layers 12, 14, 16, 18, such that an output of each of the layers 12, 14, and 16 form the basis of an input to a next layer 14, 16 and 18, and an output of a last layer in the sequence provides a result array (or "RSLT") 21 of the process 10.

By determining the significance of error values at individual layers of process 10, the computer system 100 can more efficiently determine how computational errors can be handled. For example, the computer system 100 can determine the significance of error values generated within one of the layers 12, 14, 16 and 18 to be relatively low, in which case the process 10 can be implemented with an assumption that error values generated within that layer have lesser impact on the result data array 21 of the process 10. However, if the computer system 100 determines the significance of error values generated within any of the individual layers 12, 14, 16, 18 to be of significance, the computer system 100 can perform a remedial action that reflects the determination. For example, the computer system 100 can flag portions of the result array 21 which coincide with error values that are deemed significant.

Still further, in other variations, the computer system 100 can implement corrective measures to mitigate or eliminate the significant error values within a given layer 12, 14, 16, and 18. For example, the given layer 12, 14, 16 can provide for application of a model or process that utilizes training on an array of content values. If the computer system 100 determines that the error values within the given layer 12, 14, 16, and 18 are significant, the computer system 100 can initiate a retraining for processes of the data flow, or alternatively, to partially retrain processes of the data flow that are downstream from a layer where a significant error value is identified.

In examples, the processor 110 accesses the memory 120 to retrieve and execute the instructions 112 ("implementation instructions 112") to monitor implementation of the process 10, including the multiple layers of the process. The processor 110 can, for example, execute the implementation instructions 112 to determine the data value arrays 22, 24, 26 and 28 of respective layers 12, 14, 16 and 18. The processor 110 can, for example, perform read operations on discrete memory resources, such as described with an example of FIG. 2, to determine respective data structures 22, 24, 26, and 28.

Additionally, the processor 110 can execute the implementation instructions 112 to determine a set of error values for each of the respective data value arrays 22, 24, 26, and 28. In examples, the set of error values for each data value array 22, 24, 26 and 28 can be structured as a corresponding error array (or "EA") 32, 34, 26, 38, with each error array 32, 34, 36, 38 being populated with error correcting values that represent a detected error of the respective array data structure 22, 24, 26, 28. In examples, the error values for the respective error value arrays can be implemented as offsets for corresponding values of the respective data value array 22, 24, 26, 28.

The processor 110 can execute instructions 114 ("error significance instructions 114") to determine a significance of error values for the error arrays 32, 34, 36 and 38 of corresponding layer 12, 14, 16 and 18 in which the respective local output provides the basis for an input to a next layer in the sequence. In some examples, the determination of significance is made for each cell (or node) of the respective error array 32, 34, 36 and 38. Thus, for example, the determination of significance for error values of each layer may be based on the particular cell of the respective error array 32, 34, 36, and 38 as well as the error values that populate the respective cells. In variations, the determination of significance can be based on a group of cells of each respective error array 32, 34, 36 and 38.

In some examples, the determination of significance for error values of the respective error value array 32, 34, 36 and 38 may be a binary determination. For example, an error value may be determined as insignificant if the error value is less than a threshold value, and significant if the error value is greater than or equal to the threshold. The threshold for defining error values as significant or not may be based on, for example, application and/or design parameters. In variations, the determination of significance can reflect a score or level that can range between one or multiple thresholds of insignificance or significance.

According to some examples, the processor 110 can execute instructions 116 ("process furtherance instructions 116") to affect further implementation of the process based on the significance level for at least the portion of the error values. If an error value of an error array 32, 34, 36 and 38 is deemed insignificant, the computer system 100 can affect implementation of the process 10 without, for example, adjustment of the process to account for the error. If an error value of a corresponding error value array 32, 34, 36 and 38 is deemed significant, the computer system 100 can affect implementation of the process, to account for the significant error. By way of example, the processor 110 can trigger an alert, notification or other marker that indicates a user or programmatic entity of portions of the result array 21 which are affected by error values that are significant.

Still further, the processor 110 can implement instructions to implement remedial operations at the particular layer where the significant error value(s) is determined to exist. For example, a particular layer may be subjected to an additional training operation to remediate the significant error values. As an addition or alternative, a portion of the data flow that is downstream from the particular layer where the significant error is detected may be retrained. Still further, in other implementations, the data flow may be retrained in its entirety.

In examples, the system 100 can implement a calibration step to determine a set of threshold error values for each layer of the data flow, where each threshold value defines a boundary at which the error value transitions from insignificant to significant. The set of threshold error values at individual layers can be determined through forward propagation of detected or introduced error values through the data flow, after which the forward propagated values can be evaluated for significance. In this way, the forward propagation can identify a sensitivity of the data flow 10 to the introduced error value.

In examples, an output error array 23 may be determined in connection with the result array 21, where the output error array 23 represents the forward propagation of error values that are introduced through implementation of the data flow. The output error array 23 can be evaluated to determine those nodes or cells for which the output error value is significant. The output error array 23 can be subjected to a backward propagation process which correlates the output error array to the error arrays 32, 34, 36, 38 of each of the respective layers. Each cell or node of the output error array 23 which is deemed significant can be correlated to the respective cell(s) or node(s) of one or more of the error arrays, with the value of the significant cells or nodes providing a basis for setting the threshold error value for the respective cells or nodes of the individual error arrays 32, 34, 36, 38. The calibration step can be repeated over time, to tune the value of the error thresholds, and to populate error thresholds for individual cells or nodes of the respective error arrays 32, 34, 36, 38.

Further, the system 100 can implement the data flow on various inputs which result in new error arrays 32, 34, 36, 38. Thus, the error arrays 32, 34, 36, 38 can change based on the input, while the error thresholds which are determined for each error array may remain relatively static. At each layer, the system 100 can use the error thresholds to determine whether the error values of the respective error array is significant. If use of new inputs results in error values that exceed their respective error thresholds, remedial actions can be performed. As described with other examples, the remedial actions can include flagging a portion of the result 21 which is associated with error values that are deemed significant. As an addition or alternative, the remedial action (s) can include retraining a process or model of the data flow, or alternatively, of individual layers which are downstream from layers containing where an error value of significance is detected.

The system 100 can recalibrate the error thresholds to adjust for, for example, hardware deterioration. For example, the computational hardware used to implement the data flow 10 may have an expected deterioration after a given number of uses. As an addition or alternative example, the system 100 can recalibrate the error thresholds when the model(s) or process(es) of the data flow 10 or retrained or otherwise changed.

Figure 2:
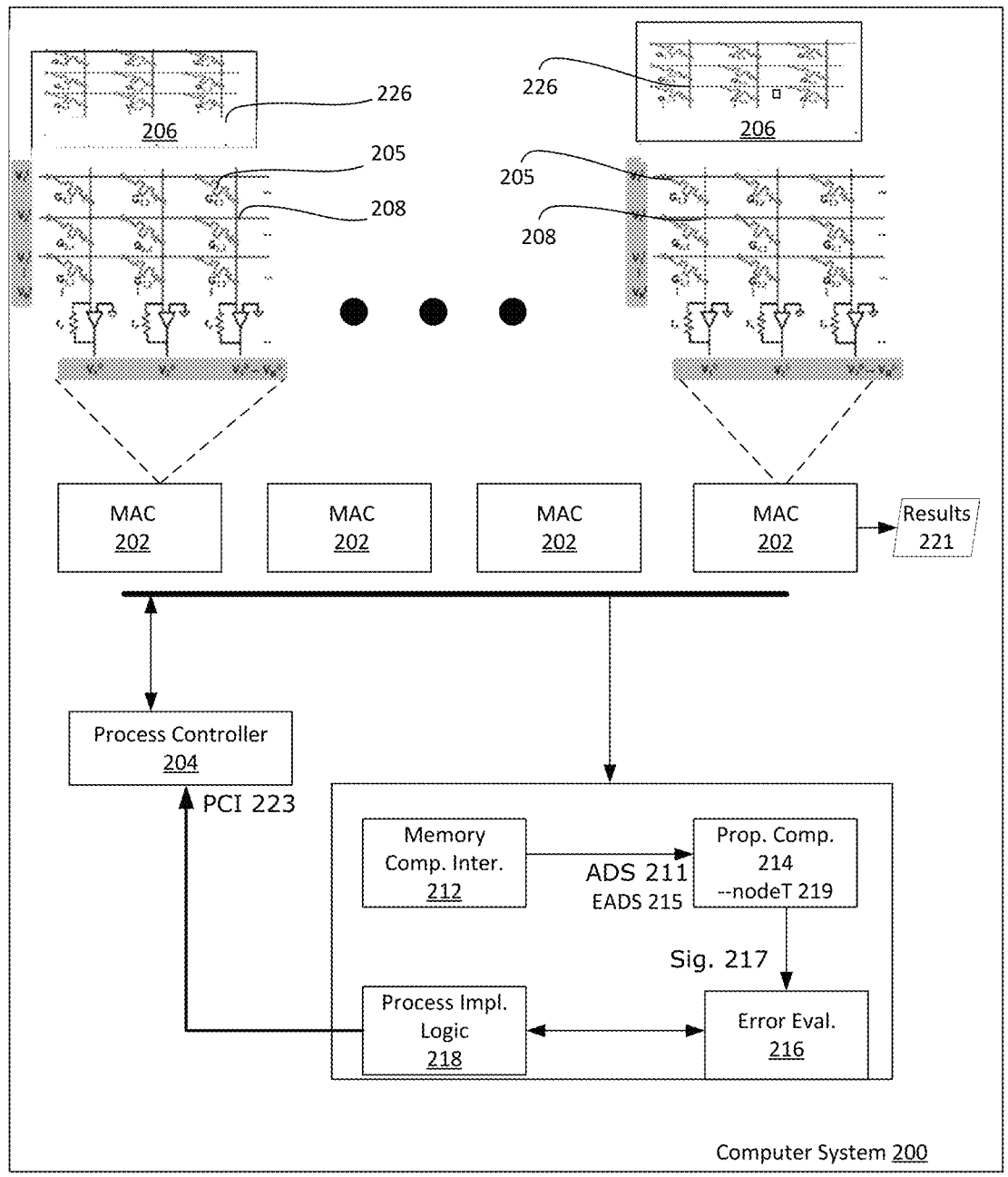
FIG. 2 illustrates an example computer system that determines the significance of error values in a multi-layered process that utilizes analog memory arrays.

FIG. 2 illustrates an example computer system that determines the significance of error values in a multi-layered process that utilizes analog memory arrays. As shown by FIG. 2, a computer system 200 includes a set of discrete analog memory array components (or "MAC") 202, a process controller 204, and error detection and evaluation (EDE) subsystem 210. In examples, the memory array components 202 are configured to implement functionality associated with a layer of a multi-layer process, with each memory array component 202 carrying a data structure of the data flow that is used by the process.

Each of the memory array components 202 can be implemented using, for example, a memristor array, such as provided by Dot Product Engine (DPE) chips, manufactured by Hewlett Packard Enterprise, Inc. each memory array component 202 can be structured as a grid of conductive leads (e.g., X leads and Y leads), where the conductive leads collectively form a collection of nodes 208. Each node 208 can further be associated with a cross-resistor 205 that joins a respective X lead and Y lead of that node. The value of the cross-resistor 205 can be tunable, such that each node 208 can represent a memory cell that operates in the analog domain to retain a value provided by the cross-resistor 205. Each memory array component 202 can receive an input voltage array to generate an array of current values as output. In an example, an input to each memory array component 202 can be defined or otherwise provided in the digital domain, then converted by a digital-to-analog converter (DAC) to the input voltage array. Similarly, the output current array of each memory array component 202 can be converted from the analog domain to the digital domain using a corresponding analog-to-digital converter (ADC). Each memory array component 202 may also be provided or associated with logic that defines a set of operations that are to be performed on the input voltage array and/or current output array. In this way, each memory array component 202 and its associated logic can be used to implement a layer of a multi-layer process, such as described with an example of FIG. 1.

The process controller 204 can implement operations that includes defining and/or applying the associated logic of each memory array component 202. Additionally, the process controller 204 can sequence the individual memory array components 202 such that an output of each memory array component 202 is either an input to another memory array or an output result 221 for the process. In examples, the process controller 204 can be implemented as hardware, firmware and/or software.

While the use of analog memory arrays are known to provide efficiencies with respect to multi-dimensional operations (e.g., matrix multiplication), examples recognize that the use of the analog domain with such devices can result in errors, such as hardware errors which can worsen in frequency and magnitude with age and use of such devices. Error detection schemes exist which utilize a provisioned portion 206 of each memory array component 202. In some implementations, the provisioned portions 206 of individual memory array components 202 can provide provisioned nodes 226 that are correlated to nodes 208 of the respective memory array components 202, to provide comparative values that can validate (or not) the values of the individual nodes 208 of each of the memory array components 202. The provisioned portions 206 of individual memory array components 202 can carry error-correction code (ECC) values that reflect a particular error detection scheme. By way of examples, the error detection schemes can utilize a Hamming metric or L1-Metric to computer ECC values for a corresponding memory array component 202.

With such error detection schemes, the provisioned portions 206 of each memory array component 202 can include provisioned nodes 226 that reflect ECC values, and which correlate to nodes 208 of the memory array component 202. By way of example, in a simple error detection scheme, a comparison of the values between the provisioned nodes 226 and the correlated nodes 208 of the memory array component 202 can provide a validation that the value carried by the node 208 is small or non-existent when, for example, the two node values are about the same. Conversely, if the comparison between the provisioned nodes 226 and the respective correlated node 208 is large, the error detection scheme can reflect an error value.

In examples, the EDE subsystem 210 includes a memory component interface 212 that reads a multi-dimensional array data structure 211 from each of the memory array components 202. In examples, the array data structure 211 that is read from each memory array component 202 can include an error array (or "EA") 215 that is read from the corresponding provisioned portion 206 of the respective memory array component 202. The error array 215 can carry the ECC values, in accordance with a selected error detection scheme for the respective memory array component 202.

The EDE subsystem 210 may further include an error propagation component 214, which can manipulate the error array 215 that is identified from each memory array component 202. In examples, the error propagation component 214 can subject the error array 215 of a given memory array component 202 to logical operations (e.g., matrix multiplication operations) that are equivalent to operations implemented at each subsequent layer of the process. In this way, the error propagation component 214 can forward-propagate the values of the error array 215 independent of the data flow, as implemented by the process utilizing the memory array components 202. In variations, the error propagation component 214 can also maximize a value carried by each cell of the memory array 215 before propagating the error.

In variations, the EDE subsystem 210 includes an error evaluation component 216 to determine the significance of individual error values for each of the error arrays 215. In an implementation, the error evaluation component 216 determines whether a given error value (or set of error values)

from each of the error arrays 215 is significant. The determination can be based on a threshold level, or alternatively, a threshold measure that is comparative to the output result 221 of the process 201. The error evaluation component 216 can associate a significance level 217 to a given error value that reflects, for example, whether a given error value exceeded a threshold level. In an implementation, the significance level 217 can reflect a binary determination (e.g., significant/insignificant). In other implementations, the significance level 217 can reflect a score or category (e.g., low significance, moderate significance, high significance, etc.) that defines a level of the impact which the error value has on the result 221. To determine the significance level 217, for example, the error evaluation component 216 can generate a maximum and minimum value for each error value, then implement the remainder of the operations of the data flow on the array data structure (or "ADS") 211 in order to determine comparative result sets. The alternative result sets can be compared under each error value scenario to determine whether the comparison of the two result sets exceeds a threshold. The determination of the significance threshold can take into account the number of cells of the result 221 which are affected by the higher error values, as well as the amount which each of the affected cells were changed.

In examples, the EDE subsystem 210 can further include process implementation logic 218 which can perform or otherwise identify actions that can be performed based on the determination of significance for error values of the error array 215. If, for example, the error values are deemed not significant, the implementation logic 218 can communicate process control input 223 to the process controller 204, in order to cause or otherwise provide for the process to be continued without any separate action to account for a specific error value or set of error values at an initial or intermediate layer. If, on the other hand, the error values are deemed significant, the implementation logic 218 can communicate process control input 223 to generate a marker, notification, content or other indicator that reflects the impact of the error value on the result 221. As an addition or alternative, the implementation logic 218 can communicate process control input 223 to initiate a remedial process to correct for error values that are significant. For example, the implementation logic 218 can cause the process controller 204 to determine, or otherwise identify weights, or initiate a training process to determine weights that correct for individual nodes 208 of respective memory array components 202 which are associated with error values that are deemed significant.

In variations, the error propagation component 214 can maintain an error node template (or "ENT") 219 for each memory array component 202 and corresponding array data structure 211, on an assumption that, absent a remedial measure (e.g., weighting the node to reduce or mitigate the error), the detected errors amongst the nodes of memory array components 202 are relatively static. In some examples, the error node template 219 can carry error thresholds that are determined for each error array 215, where the error thresholds are determined from forward-propagating error values of the respective error arrays 215, and then evaluating the forward-propagated error values for significance. The determined error thresholds can be tuned over time. In the context of a provisioned portion of a memristor array, the error thresholds can be set to the values of the cross-resistors 205. Over time, the error propagation component 214 can utilize the error node template 219 to determine whether a given node of a memory array component 202 is associated with a significant error value, rather than forward propagating the error values at each memory array component to determine whether the error values are significant.

Figure 3:
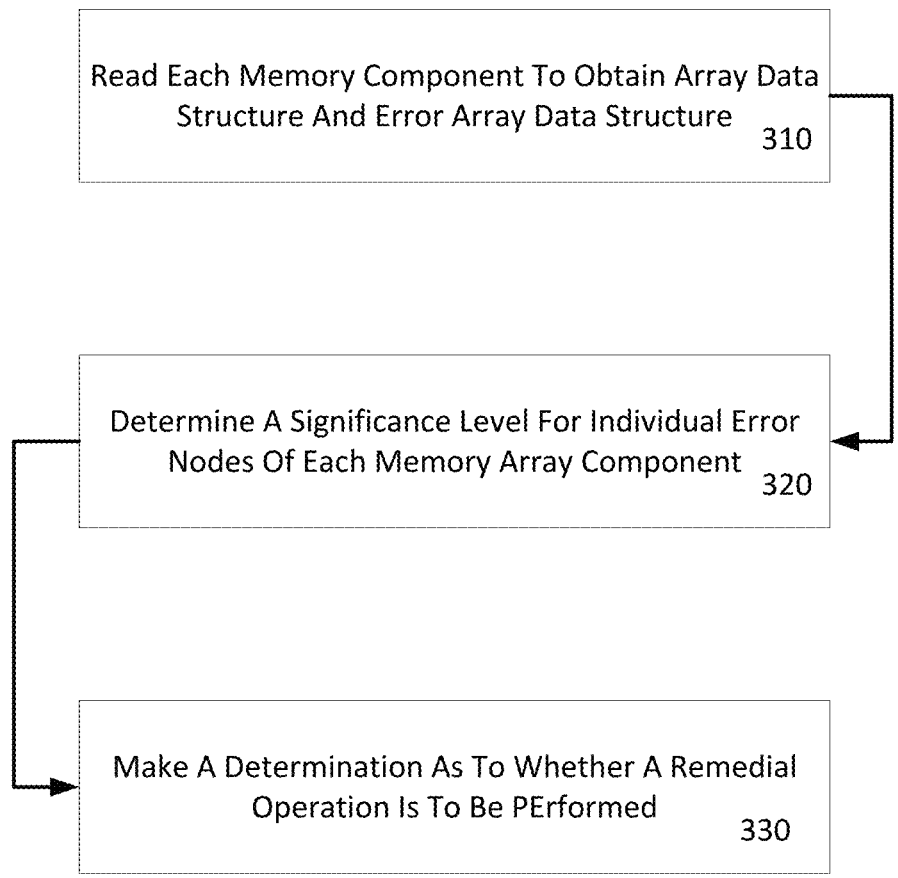
FIG. 3 illustrates an example method for determining the significance of error values in a multi-layered process that utilizes analog memory arrays.

FIG. 3 illustrates an example method for determining the significance of error values in a multi-layered process that utilizes analog memory arrays. In describing an example of FIG. 3, reference may be made to elements of FIG. 2 for purpose of illustrating suitable components for performing a step or sub-step being described.

In particular, an example of FIG. 3 may be implemented using a computer system that utilizes multiple memory array components, arranged in a sequence, such that an output of one memory array component is a basis for an input to another memory array component, with a final memory array component providing a result (or basis thereof) for the process. In an example, each memory array component 202 can be read to obtain a respective array data structure 211 and error array 215 (310).

Further, in such examples, a significance level is determined for individual nodes of the error array 215 that is associated with each of the respective memory array components 202 (320). By way of example, the error array 215 of each memory array component 202 may reflect a set of ECC values, determined through a respective error detection schema, as applied to a memristor array circuits that comprise the respective memory array component. The significance level of each node may be determined by, for example, propagating the error array 215, with inflated, minimized and/or actual error values for the individual nodes, through a series of operations that reflect the remainder of the process that is to be performed on the corresponding array data structure 211. In examples, the significance level can correspond to a binary determination that reflects whether the detected ECC values are above or below a determined error threshold, where the threshold can be determined from forward propagating respective error values determined at each layer.

In some examples, the determination of the significance level may be based on a measure of the impact of the error values on the result. In examples, the determination of the significance levels may include comparative operations that utilize, for example, maximized error values for the respective error arrays 215. The considerations for determining the significance levels can include identification of cells in the process result which are impacted by the error values, as well as the magnitude of such impact.

According to an example, the computer system makes a determination as to whether a remedial operation is to be performed with respect to the process being implemented by the multiple memory array components 202 (330). As described, the determination may be based at least in part on the significance level of the individual nodes of the respective error array 215. By way of example, the remedial operation(s) can include the computer system 100 performing an operation to indicate that a portion of a result is suspect, based on the determination that error values of the error array 215 of a particular memory array component 202 are significant. As an addition or variation, weights can be learned or applied to nodes of individual array data structures which correlate to nodes (or cells) of the respective array data structure that are deemed significant.

As an addition or alternative, the processes that are implemented by the collective memory array component 202 can be retrained to mitigate the detected errors of significance. Still further, in other variations, the retraining can be limited to those processes that utilize memory array components 202 which follow the memory array component where the errors of significance are found.

While some examples are described in context of an analog memory devices (DPE), in variations, examples as described may be implemented with other kinds of dot product engines, including digital dot product engines. Still further, examples as described can be implemented in context of multi-layered models and algorithms that utilize sequencing of data arrays, and error correction values resulting from hardware, software or firmware variations or deteriorations.

It is contemplated for examples described herein to extend to individual elements and concepts described herein, independently of other concepts, ideas or system, as well as for examples to include combinations of elements recited anywhere in this application. Although examples are described in detail herein with reference to the accompanying drawings, it is to be understood that the concepts are not limited to those precise examples. Accordingly, it is intended that the scope of the concepts be defined by the following claims and their equivalents. Furthermore, it is contemplated that a particular feature described either individually or as part of an example can be combined with other individually described features, or parts of other examples, even if the other features and examples make no mentioned of the particular feature. Thus, the absence of describing combinations should not preclude having rights to such combinations.

What is claimed is:

1. A computer system comprising:
   a processor;
   a memory medium to store a set of instructions;
   the processor executing the set of instructions to perform steps that include:
   monitor a process that includes implementing multiple layers to manipulate data flow in accordance with a sequence, and for each of the multiple layers, the process includes subjecting a respective multi-dimensional data set of the data flow to at least an operation to generate a respective output, the respective output of each of the multiple layers being a basis for at least one of an input to a next layer of the sequence, or a result of the process, and wherein at each layer, the process includes identifying a corresponding set of error values that reflect computational error caused by implementation of at least the operation on a correlated portion of the respective multi-dimensional data set of that layer;
   determine, from monitoring a given layer in which the respective output is the input to the next layer of the sequence, a significance level for at least a portion of the corresponding set of error values with respect to the result of the process, wherein the significance level is determined as insignificant if an error value is less than an error threshold for the given layer, and the significance level is determined as significant if the error value is greater than or equal to the error threshold for the given layer; and
   affect further implementation of the process based on the determined significance level for at least the portion of the corresponding set of error values.

2. The computer system of claim 1, wherein the processor performs an action based on the determined level of significance for at least the portion of the corresponding set of error values.

3. The computer system of claim 1, wherein the processor determines the significance level for at least the portion of the corresponding set of error values with respect to the result of the process by subjecting the portion of the corresponding set of error values to a remainder of the multiple layers.

4. The computer system of claim 3, wherein the processor subjects the portion of the corresponding set of error values to the remainder of the multiple layers as a separate process that is independent of the data flow.

5. The computer system of claim 4, wherein the processor determines the significance level for at least the portion of the corresponding set of error values with respect to the result of the process by comparing the result of the process to an alternative result that is based on the portion of the corresponding set of error values.

6. The computer system of claim 5, wherein the processor affects further implementation of the process by taking no action to modify the process based on the determined significance level of the portion of the corresponding set of error values being deemed as not significant.

7. The computer system of claim 5, wherein the processor affects further implementation of the process by indicating a portion of the result that is impacted by the correlated portion of the respective multi-dimensional data set, based on the determined significance level of the portion of the corresponding set of error values being deemed as significant.

8. The computer system of claim 5, wherein the processor affects further implementation of the process by initiating a remedial action to apply corrective values for the correlated portion of the respective multi-dimensional data set.

9. The computer system of claim 1, wherein the error threshold for defining error values as significant or insignificant is based on application parameters or design parameters.

10. The computer system of claim 9, wherein the error threshold is determined for each layer of the data flow such that each error threshold defines a boundary at which the error value transitions from insignificant to significant.

11. The computer system of claim 10, wherein the error threshold is recalibrated to adjust for a hardware deterioration of associated computational hardware used to implement the data flow after a given number of uses.

12. The computer system of claim 10, wherein the error threshold is recalibrated to adjust for a change of the process manipulating the data flow.

13. The computer system of claim 1, wherein for each of the multiple layers, each of (i) the respective multi-dimensional data set of the data flow and (ii) the corresponding set of error values is a respective array data structure.

14. The computer system of claim 13, wherein the respective array data structure of each layer of the multiple layers is provided by a corresponding memristor array.

15. A computer system comprising:
    a processor;
    a memory medium to store a set of instructions;
    multiple memory array components, each memory array component being associated with an array data structure and an error array data structure that includes error correction codes (ECC) for the associated array data structure;
    wherein the multiple memory array components are configured to implement a process that generates a result, with each memory array component being associated with a layer of the process;
    wherein the processor executes the set of instructions to:
    for each memory array component, (i) determine a significance level of individual nodes of the respective error array data structure, wherein the significance level associated with each of the individual nodes is determined as insignificant if an error value of the individual node is less than an error threshold for a given layer, and the significance level is determined as significant if the error value of the individual node is greater than or equal to the error threshold for the given layer; and (ii) make a determination as to whether a remedial operation is to be performed with respect to the process being implemented by the multiple memory array components, the determination being based on the significance level of the individual nodes of the respective error array data structure.

16. The computer system of claim 15, wherein each memory array component includes an analog-based memristor array component to store the associated array data structure and the error array data structure.

17. The computer system of claim 15, wherein individual nodes of each error array data structure correlate to respective nodes of the associated array data structures, and wherein the remedial operation includes identifying a portion of the result that is impacted by the respective nodes of the associated array data structure for which the correlated nodes have a significance level that is deemed significant.

18. The computer system of claim 15, wherein the process determines a significance level for individual nodes by propagating each respective node through a set of operations that are equivalent to a remainder of a multi-layered process for the memory array component.

19. A method for determining the significance of error values in multi-layered processes, the method comprising:
reading from each memory array component of multiple memory array components that are sequenced to implement a multi-layer process, wherein each memory array component utilizes an analog memory array to obtain an array data structure and an error array data structure;
for each memory array component, determining a significance level of individual nodes of the respective error array data structure, wherein the significance level associated with each of the individual nodes is determined as insignificant if an error value of the individual node is less than an error threshold for a given individual node, and the significance level is determined as significant if the error value of the individual node is greater than or equal to the error threshold for the given individual node; and
making a determination as to whether a remedial operation is to be performed with respect to the multi-layered process being implemented by the multiple memory array components, the determination being based on the significance level of the individual nodes of the respective error array data structure.

20. The method of claim 19, wherein determining the significance level includes propagating each respective node through a set of operations that are equivalent to a remainder of the multi-layered process for the respective memory array component.

21. The method of claim 19, further comprising:
in response to making the determination, performing the remedial operation.

22. The method of claim 21, wherein individual nodes of each error array data structure correlate to respective nodes of an associated array data structure, and wherein performing the remedial operation includes identifying a portion of the result that is impacted by the respective nodes of the associated array data structure for which the respective nodes have the significance level of significant and exceeding the error threshold.

23. The method of claim 22, wherein performing the remedial operation includes retraining a portion of the multi-layered process based on the identified portion of the result.

24. The method of claim 22, wherein performing the remedial operation includes applying weights to individual nodes of the respective error array data structure for which the respective nodes have the significance level of significant and exceeding the error threshold.

25. The method of claim 19, further comprising:
determining the error threshold for each of the individual nodes of the respective error array data structure;
and repeat determining the error threshold to tune the value of the error thresholds, and to populate error thresholds for each of the individual nodes of the respective error array data structure.

* * * * *